US011874022B1

(12) United States Patent
Ahmad

(10) Patent No.: US 11,874,022 B1
(45) Date of Patent: *Jan. 16, 2024

(54) HEAT-ACTIVATED MULTIPHASE FLUID-OPERATED PUMP FOR GEOTHERMAL TEMPERATURE CONTROL OF STRUCTURES

(71) Applicant: HAMFOP Technologies LLC, Sacramento, CA (US)

(72) Inventor: Mudasir Ahmad, San Jose, CA (US)

(73) Assignee: Hamfop Technologies LLC, Sacramento, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/472,375

(22) Filed: Sep. 10, 2021

Related U.S. Application Data

(60) Provisional application No. 63/076,546, filed on Sep. 10, 2020.

(51) Int. Cl.
*F24F 5/00* (2006.01)
*F24D 11/02* (2006.01)
(Continued)

(52) U.S. Cl.
CPC ............ *F24F 5/0046* (2013.01); *F24D 11/02* (2013.01); *F24F 5/0035* (2013.01); *F24S 10/95* (2018.05);
(Continued)

(58) Field of Classification Search
CPC ......... F24F 5/0035; F25B 23/00; F25B 23/06; F25B 9/14; F28D 15/025; F24S 10/95
See application file for complete search history.

(56) References Cited

U.S. PATENT DOCUMENTS 1,781,541 A   11/1930 Einstein et al.
2,927,434 A   3/1960 MacCracken
(Continued)

FOREIGN PATENT DOCUMENTS

CN   102410187 A1   4/2012
EP   0251664 B1    4/1990
(Continued)

OTHER PUBLICATIONS

Printout: Wikipedia, "Ground-coupled heat exchange", https://en.wikipedia.org/w/index.php?title=Ground-coupled_heat_exchange&oldid=1028963414, 6 pgs.
(Continued)

*Primary Examiner* — Christopher R Zerphey
(74) *Attorney, Agent, or Firm* — Mark Protsik; Thomas Schneck

(57) ABSTRACT

A heat-activated fluid pump heats and cools a building. For cooling, an evaporator, coupled to a solar heater or comprising multi-pane windows with solar radiation-absorbent areas thermally coupled to a fluid cavity, converts a working fluid into a vapor. A pressure control valve allows vaporized working fluid into a liquid-piston chamber whenever a target pressure in the evaporator is exceeded. The working fluid expands, displacing liquid from the liquid-piston chamber in a pump stage where it enters a condenser situated in a vertical hole or covered horizontal trench in the ground. Ground-temperature pumped fluid returning to the liquid-piston chamber in a suction stage passes along the way through coils in rooms of the building. Check valves allow replenishment of the evaporator with return working fluid and direct flow of pumped fluid into and out of the liquid-piston chamber. For heating, the evaporator is in the ground.

20 Claims, 5 Drawing Sheets

(51) Int. Cl.
*F24S 10/95* (2018.01)
*F24T 10/10* (2018.01)
*F25B 23/00* (2006.01)
*F24F 140/10* (2018.01)

(52) U.S. Cl.
CPC .............. *F24T 10/10* (2018.05); *F25B 23/00* (2013.01); *F24F 2005/0064* (2013.01); *F24F 2140/10* (2018.01)

(56) References Cited

U.S. PATENT DOCUMENTS

| | | | | |
|---|---|---|---|---|
| 4,280,333 | A | * | 7/1981 | Corliss ................. F24D 11/003 165/53 |
| 4,314,601 | A | | 2/1982 | Giuffe et al. |
| 4,545,365 | A | | 10/1985 | Wetzel, Jr. |
| 4,576,009 | A | * | 3/1986 | Ogushi ................. F25B 23/006 105/29.1 |
| 4,967,831 | A | * | 11/1990 | Leland .................. F04B 17/044 384/42 |
| 5,005,639 | A | * | 4/1991 | Leland .................. F28D 15/043 384/42 |
| 5,129,788 | A | | 7/1992 | Okayasu |
| 5,203,399 | A | * | 4/1993 | Koizumi ............... H01L 23/427 361/699 |
| 5,758,514 | A | | 6/1998 | Genung et al. |
| 5,816,313 | A | * | 10/1998 | Baker ................... F28D 15/043 165/41 |
| 6,042,342 | A | * | 3/2000 | Orian ........................ F04F 1/06 417/208 |
| 7,263,848 | B2 | | 9/2007 | Bhatti |
| 7,380,584 | B2 | | 6/2008 | Ippoushi et al. |
| 7,503,176 | B2 | * | 3/2009 | Yatsuzuka ................. F01K 9/02 60/659 |
| 7,971,449 | B2 | | 7/2011 | Peterson et al. |
| 8,209,992 | B2 | | 7/2012 | Alden et al. |
| 8,419,378 | B2 | | 4/2013 | Fenton et al. |
| 8,468,845 | B2 | * | 6/2013 | Chordia ................. F24T 10/10 62/260 |
| 8,820,114 | B2 | | 9/2014 | Charamko et al. |
| 9,046,288 | B2 | * | 6/2015 | Cho ....................... F25B 23/006 |
| 9,091,490 | B2 | * | 7/2015 | Weinstein ............. F28D 15/025 |
| 9,212,826 | B2 | | 12/2015 | Everett et al. |
| 9,239,063 | B2 | | 1/2016 | Fenton et al. |
| 9,273,908 | B2 | * | 3/2016 | Chludzinski .......... F28D 15/025 |
| 9,476,615 | B2 | * | 10/2016 | Park ......................... F25B 13/00 |
| 9,784,509 | B2 | | 10/2017 | Al-Hallaj et al. |
| 9,829,253 | B2 | | 11/2017 | Mishkinis et al. |
| 9,869,274 | B2 | | 1/2018 | Fuhrman |
| 9,939,201 | B2 | * | 4/2018 | Furlong .................... F28B 1/02 |
| 10,041,708 | B2 | | 8/2018 | Sedlak et al. |
| 10,060,681 | B2 | * | 8/2018 | Sharp ...................... F24S 10/95 |
| 10,156,203 | B2 | * | 12/2018 | Klassen .................... F02G 1/05 |
| 10,436,521 | B2 | | 10/2019 | Cho et al. |
| 10,591,221 | B1 | | 3/2020 | Tucker et al. |
| 10,605,501 | B2 | | 3/2020 | Bangheri |
| 10,712,100 | B2 | | 7/2020 | Adamson et al. |
| 10,830,503 | B2 | | 11/2020 | Kopko |
| 10,914,266 | B2 | | 2/2021 | Rolandson |
| 10,962,304 | B2 | | 3/2021 | Adamson et al. |
| 2009/0129946 | A1 | | 5/2009 | Toubia et al. |
| 2021/0002843 | A1 | * | 1/2021 | Kemp ...................... F24T 10/17 |

FOREIGN PATENT DOCUMENTS

| | | |
|---|---|---|
| EP | 2927038 A1 | 10/2015 |
| GB | 303065 A1 | 5/1930 |
| GB | 1329567 A1 | 9/1973 |
| GB | 2015654 A1 | 9/1979 |
| KR | 1020120056521 A1 | 6/2012 |
| WO | WO2005035987 A3 | 4/2005 |
| WO | WO2005042981 A1 | 5/2005 |
| WO | WO2005121539 A1 | 12/2005 |
| WO | WO2012091816 A3 | 7/2012 |
| WO | WO2013149621 A1 | 10/2013 |
| WO | WO2020030933 A1 | 2/2020 |

OTHER PUBLICATIONS

Printout: Wikipedia, "Ground source heat pump", https://en.wikipedia.org/w/index.php?title=Ground_source_heat_pump&oldid=1041429632, 13 pgs.
Paper: Sid Mikelbank, Engineering and design, https://www.engineeringanddesign.com/1/036.htm, 2 pgs.
Article: J.W. Mason et al., "Design and construction of a solar-powered fluidyne test bed", Proceedings of the ASME 2011 Mechanical Engineering Conference, Nov. 11, 2011, 12 pages.
Paper: T.M. Kuzay et al., "Enhanced heat transfer with metal wool filled tubes", Conference-910375-1, DE91 005831, (osti.gov 6329405), Aug. 1990, 32 pages.
Printout: MicroCool, 3000 series coldplates data sheet, www.microcooling.com, Mar. 15, 2016, 2 pages.
Printout: "Liquid cooling vs. air cooling: What you need to know", https://www.pcworld.com/article/2028293/liquid-cooling-vs-traditional-cooling-what-you-need-to-know.html, by David Murphy, Feb. 19, 2013, 2 pages.
Article: G. Dannen, "The Einstein-Szilard Refrigerators", Scientific American, Jan. 1997, 6 pages.
Printout: "Introduction to safety valves", Spirax Sarco, https://www.spiraxsarco.com/learn-about-steam/safety-valves/safety-valves, Sep. 1, 2020, 29 pages.
Printout: "Heat conducting 3D printing plastics", TCPoly, High performance plastic cold plates datasheet, www.tcpoly.com/products/coldplates, Sep. 10, 2019, 2 pages.
Article: James D. Van de Ven et al., "Developments towards a liquid piston Stirling Engine", American Institute of Aeronautics and Astronautics, Tracking# 132055, Paper #5635, Jun. 20, 2008, 9 pages.
Article: A.H. Zamanian et al., Identification and compensation of cogging and friction forces in tubular permanent magnet linear motors, Proceedings of the ASME 2017 Dynamic Systems and Control Conference, Oct. 11, 2017, 8 pages.
Article: B. Zohuri, "Basic principles of heat pipes and history", Heat Pipe Design and Technology, DOI 10.1007/978-3-319-29841-2_1, Apr. 2016, 41 pages.
Article: Jinwang Li et al., "Experimental study on evaporation-capillary pumping flow in capillary wick and working fluid system", Thermal Science, Jan. 2019, 12 pages.
CN 102410187A, English translation, 12 pages.
KR 20120056521A, English translation, 12 pages.
Wikipedia: "Absorption refrigerator, https://en.wikipedia.org/w/index.php?title=Absorption_refrigerator&oldid=970309157", Jul. 30, 2020, 5 pages.
Wikipedia: "Check valve, https://en.wikipedia.org/w/index.php?title=Check_valve&oldid=973253068", Aug. 16, 2020, 7 pages.
Wikipedia: "Computer cooling, https://en.wikipedia.org/w/index.php?title=Computer_cooling&oldid=1045406650", Sep. 20, 2021, 23 pages.
Wikipedia: "Einstein refrigerator, https://en.wikipedia.org/w/index.php?title=Einstein_refrigerator&oldid=973585763", Aug. 18, 2020, 3 pages.
Wikipedia: "Heat pipe, https://en.wikipedia.org/w/index.php?title=Heat_pipe&oldid=973161839", Aug. 15, 2020, 15 pages.
Wikipedia: "Immersion cooling", https://en.wikipedia.org/w/index php"title=Immersion_cooling&oldid=1043510651", Sep. 10, 2021, 8 pages.
Wikipedia: "Injector, https://en.wikipedia.org/w/index.php?title=Injector&oldid=967631660", Jul. 14, 2021, 7 pages.
Wikipedia: "List of refrigerants, https://en.wikipedia.org/w/index.php?title=List_of_refrigerants&oldid=1035339680", Jul. 26, 2021, 17 pages.
Wikipedia: "Loop heat pipe, https://en.wikipedia.org/w/index.php?title=Loop_heat_pipe&oldid=952560728", Apr. 22, 2020, 3 pages.
Wikipedia: "Metal foam, https://en.wikipedia.org/w/index.php?title=Metal_foam&oldid=1044893829", Sep. 17, 2021, 13 pages.

(56) References Cited

OTHER PUBLICATIONS

Wikipedia: "Relief valve, https://en.wikipedia.org/w/index.php?title=Relief_valve&oldid=974509246", Aug. 23, 2020, 4 pages.
Wikipedia: "Safety valve, https://en.wikipedia.org/w/index.php?title=Safety_valve&oldid=957512538", May 19, 2020, 11 pages.
Wikipedia: "Thermal management (electronics), https://en.wikipedia.org/w/index.php?title=Thermal_management_ electronics)&oldid=1038841962", Aug. 15, 2021, 11 pages.
Wikipedia: "Thermosiphon, https://en.wikipedia.org/w/index.php?title=Thermosiphon&oldid=960989907", Jun. 6, 2020, 4 pages.
Printout: "Capillary limit", Advanced Cooling Technologies, https://www.1-act.com/resources/heat-pipe-performance/capillary-limit/, Nov. 20, 2017, 5 pages.
Printout: "IGBT Cold Plates ATS-CP-1002", Advanced Thermal Solutions, Inc., Cold plates data sheet, Apr. 24, 2018, 2 pages.
Printout: "Closed loop liquid cooling for high power electronics", Advanced Thermal Solutions, Inc., Qpedia, vol. 1, issue 9, Oct. 2007, 5 pages.
Printout: "Liquid cooling systems and their components", Qpedia Newsletter, Apr. 2009, 4 pages.
Article: James D. Van de Ven et al., "Liquid piston gas compression", Applied Energy, Jan. 6, 2009, 9 pages.
Printout: "Futuristic engine for the new hybrid cars: free piston linear alternator (FPLA)", Bright Hub Engineering, Oct. 8, 2001, 2 pages.
Printout: "Which pump should you use? D5 or DDC?", https://www.ekwb.com/blog/which-pump-should-you-use-d5-or-ddc/, Nov. 11, 2016, 6 pages.
Article: S. Langdon-Arms et al., "Development of a solar-powered liquid piston Stirling refrigerator", Energy Procedia, 142, 570-575, 9th Int'l Conference, ICAE2017, Aug. 21, 2017, 6 pages.

* cited by examiner

HEAT-ACTIVATED MULTIPHASE FLUID-OPERATED PUMP FOR GEOTHERMAL TEMPERATURE CONTROL OF STRUCTURES

CROSS-REFERENCE TO RELATED APPLICATION

The present application claims priority under 35 U.S.C. 119(e) from U.S. Provisional Application 63/076,546, filed Sep. 10, 2020.

TECHNICAL FIELD

The present invention relates to heat-activated pumping devices for the transport of heat, and especially those adapted for heating and cooling of residential, commercial, and agricultural buildings and other similar structures.

BACKGROUND ART

In rural tropical areas, where there is abundant annual sunshine, a key challenge to the quality of life of residents is the heat. Homes are usually built with insulating materials to minimize the heat and livestock is kept in sheds to minimize overheating. Conversely, in cold climates, there is a need to heat up living spaces to prevent frost while limiting the use of climate change inducing heating sources (like coal, fossil fuels, etc.). There is a need to keep living spaces for both humans and animals at a controlled temperature for comfort, productivity, and quality of life. The living spaces could be residences, schools, offices, livestock sheds or even sheds/enclosures housing electronic equipment (transformers, control devices, etc.).

Conventional air temperature control solutions in use today span electrical air conditioning units, adsorption systems (based on fluids like ammonia, water, methanol, etc.) and geothermal heating ventilation and air conditioning (HVAC).

1. Electrical air conditioning units are very expensive and require high electrical power. Solar photovoltaic (PV) based electrical generation coupled with inverters to drive these AC units is a well-established technology. However, this technology is very expensive and requires significant infrastructure to implement and maintain. This would not be viable or scalable in low-cost rural areas or even in expensive urban areas from a climate change and energy consumption perspective.

2. Adsorption systems in which vapor molecules are adsorbed into a solid, are used effectively for cooling applications. However, they have considerable capital investment costs and high operating costs especially for efficient systems which typically use ammonia or methane.

3. Geothermal heating and cooling involve utilizing the near constant temperature of the ground to sink or dump heat into the ground. In tropical climates, the heat from the living space can be dumped into the ground via vertically dug holes or horizontally coiled tubes buried into the ground. It can be quite effective, efficient, and low cost. The main costs of the geothermal process are comprised of the underground piping that needs to be laid out (land space for horizontal setups and the boring of deep holes for vertical setups) and the heat pump. In many areas, the space is available and with labor costs low (or during home construction), the cost of digging the ground can be managed. However, the cost of the heat pump and its maintenance remain a challenge.

There is a need for a low-cost heat-activated pump that can enable scaling of geothermal solutions in areas where it makes economic sense, the materials can be locally procured, and the pump can last a long time.

SUMMARY DISCLOSURE

A heat-activated pump is provided for the temperature regulation of a building. An evaporator containing a working fluid is receptive of heat from a building to convert the working fluid into vapor. A pressure-control safety valve is coupled to an exit port of the evaporator and maintains the working fluid in the evaporator at a set target pressure, allowing vaporized working fluid to escape through the exit port whenever the target pressure is exceeded. A liquid-piston chamber is coupled to the pressure-control valve to receive vaporized working fluid from the evaporator at the target pressure, where the vaporized working fluid expands adiabatically, displacing liquid within the liquid-piston chamber and expelling it therefrom in a pumping stage of a thermodynamic cycle. A unidirectional pump-exit check valve coupled to an exit port of the liquid-piston chamber allows the displaced liquid to exit the liquid-piston chamber to a condenser. The pumped liquid returns from the condenser through a unidirectional liquid suction-entry check valve coupled to a return port of the liquid-piston chamber in a suction stage of the thermodynamic cycle. A unidirectional vapor-injector return check valve is coupled between an exit port of the liquid-piston chamber and an input port of the evaporator, wherein periodic pressure pulses from the liquid-piston chamber that temporarily exceed the pressure in the evaporator facilitate jets of condensed fluid to return to the evaporator in successive brief spurts.

The evaporator may comprise one or more multi-pane windows of the building, the windows having one or more regions with solar radiation-absorbent material thermally coupled to a fluid cavity.

The condenser is located underground at a substantially constant earth temperature. The condenser can be situated either in a vertical hole in the ground or in a covered horizontal trench in the ground.

The pumped liquid in the liquid-piston chamber can be the same material as the working fluid, or can be a different immiscible material of different density from the working fluid. In the latter case, a separator would be coupled between the liquid-piston chamber and the exit ports thereof to direct the working fluid to the vapor-injector return check valve leading back to the hot chamber and the displaced liquid to the pump-exit check valve leading to the condenser.

DETAILED DESCRIPTION

Nomenclature

Working Fluid: The fluid whose change in phase is utilized to performing the pumping operation. The working fluid could be selected from a variety of fluid options: water, as well as commonly used or new refrigerants (e.g., R-130, R-245fa, R-407c, R-410a, R-454b, R-1234yf, etc.). In addition to performance and desired temperature range, safety (flammability and exposure limits) will be factors in the choice of working fluid.

Pumped Fluid: The fluid which is needs to be pumped from one location to another. This could be the same as the working fluid or it could be a different fluid altogether. If the pumped fluid is different, it would need to be immiscible with the working fluid.

Ambient Temperature: The temperature in the general environment around the region or device in focus.

The Heat-Activated Multiphase Fluid-Operated Pump

The HAMFOP pump utilizes heat to pump a fluid. The heat is used to convert a working fluid from liquid to vapor. The vapor is then used to displace the fluid that needs to be pumped.

Figure 1:
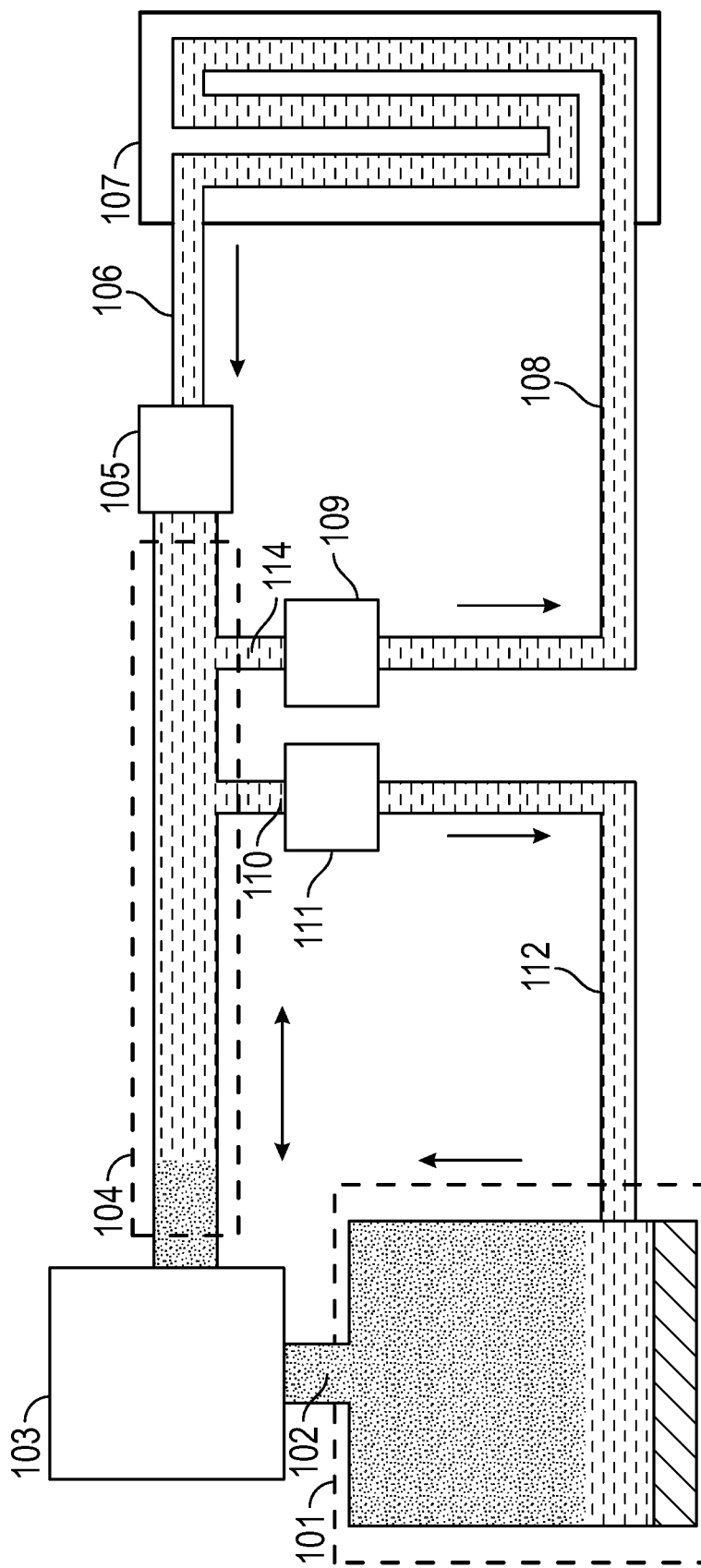
FIG. 1 is a schematic plan view of a heat-activated multiphase fluid-operated pump (HAMFOP) in accord with the present invention.

The principle of operation is as follows, as referenced by the numbered elements in FIG. 1, assuming that both the working fluid and the pumped fluid are the same:

1. Heat is applied to the hot chamber or evaporator 101, which contains a small quantity of the working fluid in liquid form. As it is heated, the working fluid is transformed into vapor 102 at a high pressure based on the amount of heat applied and temperature and sizing of the hot chamber 101.
2. The pressurized vapor pushes against the base of the pressure control valve 103, which is counteracted by a deadweight or equivalent load applied on top of it. Once the pressure of the vapor 102 exceeds the deadweight load, the valve 103 opens and the vapor 102 enters a piston/suction chamber 104, which has a larger area. The larger area ensures that the force applied by the vapor 102 remains high enough to keep the valve 103 open until a desired amount of the vapor 102 exits the hot chamber 101. This operation is similar to the principle of operation of a typical safety valve.
3. When the vapor 102 enters the piston/suction chamber 104, which already contains the fluid 114 that needs to be pumped, the high-pressure vapor 102 rapidly expands and displaces the pump fluid 114 from the entry side of the piston chamber 104 towards an exit side (on the right in FIG. 2).
4. The rapid adiabatic expansion of the vapor 102 induces a periodic pressure pulse that flows through the pumped fluid 114 in the piston chamber 104. Since the pumped fluid 114 is incompressible, this temporarily raises the pressure in the piston chamber 104, while the pressure in the hot chamber 101 temporarily decreases due to the loss of the vapor 102. This creates a positive pressure differential between the piston chamber 104 and the hot chamber 101, which results in the opening of a return valve 111. Due to the pressure pulse generated by the rapid entry of the vapor 102 and the incompressibility of the pumped fluid 114, the pressure in the piston chamber 104 transiently rises to a value above the vapor entry pressure. The increased pressure in the piston chamber 104 causes the return valve 111 to open (acting like an injector). Some of the pumped working fluid 110 flows through the return valve 111 and enters via a replenishment passageway 112 back into the hot chamber 101 for re-heating. Once enough working fluid 110 has flowed into the hot chamber 101 to equilibrate the pressure, the return valve 111 closes. This operation is similar to the function that an injector performs in steam engines: high-pressure vapor is used to push a fluid into a high pressure and high temperature evaporator.
5. Since the piston chamber 104 now has slightly less fluid, the working vapor 102 continues to expand adiabatically and push against the pumped fluid 114. As the pressure in the piston chamber 104 continues to remain high, the pump exit valve 109 opens and lets out the fluid 114 via a passageway 108 into the condenser 107. This continues until the fluid 114 has been evacuated from the piston chamber 104 and the pressure in the piston chamber 104 reduces to a pressure close to that in the condenser 107.
6. Upon displacing the pumped fluid 114, the vapor 102 remaining in the piston chamber 104 expands into a larger volume, so it condenses, resulting in a reduction in pressure in the piston chamber 104, to a value below the pressure in the condenser 107. As a result, the pump valve 109 closes, completing the pump portion of the cycle and beginning a suction phase. The suction valve 105 now opens due to the negative differential pressure between the condenser 107 and the piston chamber 104, letting fresh working fluid 106 in. Due to the negative differential pressure, fluid 106 is drawn into the piston chamber 104 from the condenser 107.
7. While the pressure in the piston chamber 104 is below that of the condenser 107, the pressure control valve 103 remains closed to ensure no new vapor 102 enters the piston chamber 104 until the piston chamber pressure returns to above the condenser pressure, concluding the suction phase of the cycle.
8. Once the fluid in the piston chamber 104 has been replenished and the pressure is raised to the pressure of the condenser 107, the pressure control valve 103 re-opens, letting in vapor 102 to repeat the cycle.
9. In some embodiments, an electricity generator module may generate an electrical current induced in winding coils around the piston chamber during the continuous cyclic operation of the pump.

In the case where the pumped fluid 114 (and 106) is composed of a different material from the working fluid 102 (and 110), and not merely a different liquid-vapor phase of the same material, a difference in density between the working and pumped fluids can be leveraged to separate them. The elements of such an embodiment are largely identical to structure and operation to those in FIG. 1, except for the addition of a separator, in which the pumped fluid and the working fluid are separated. The pumped fluid 114 and 106 being of lower density would float to the top while the working fluid 102 and 110 would sink to the bottom. Accurate tuning (balancing the precise quantity of working and pumped fluid) would need to be performed to ensure that the separator chamber never ends up without any working fluid at all. If that were to happen, then some of the pumped fluid could enter the hot chamber 101, thus interrupting the cycle.

Heat-Activated Pump for Geothermal Cooling

Figure 2:
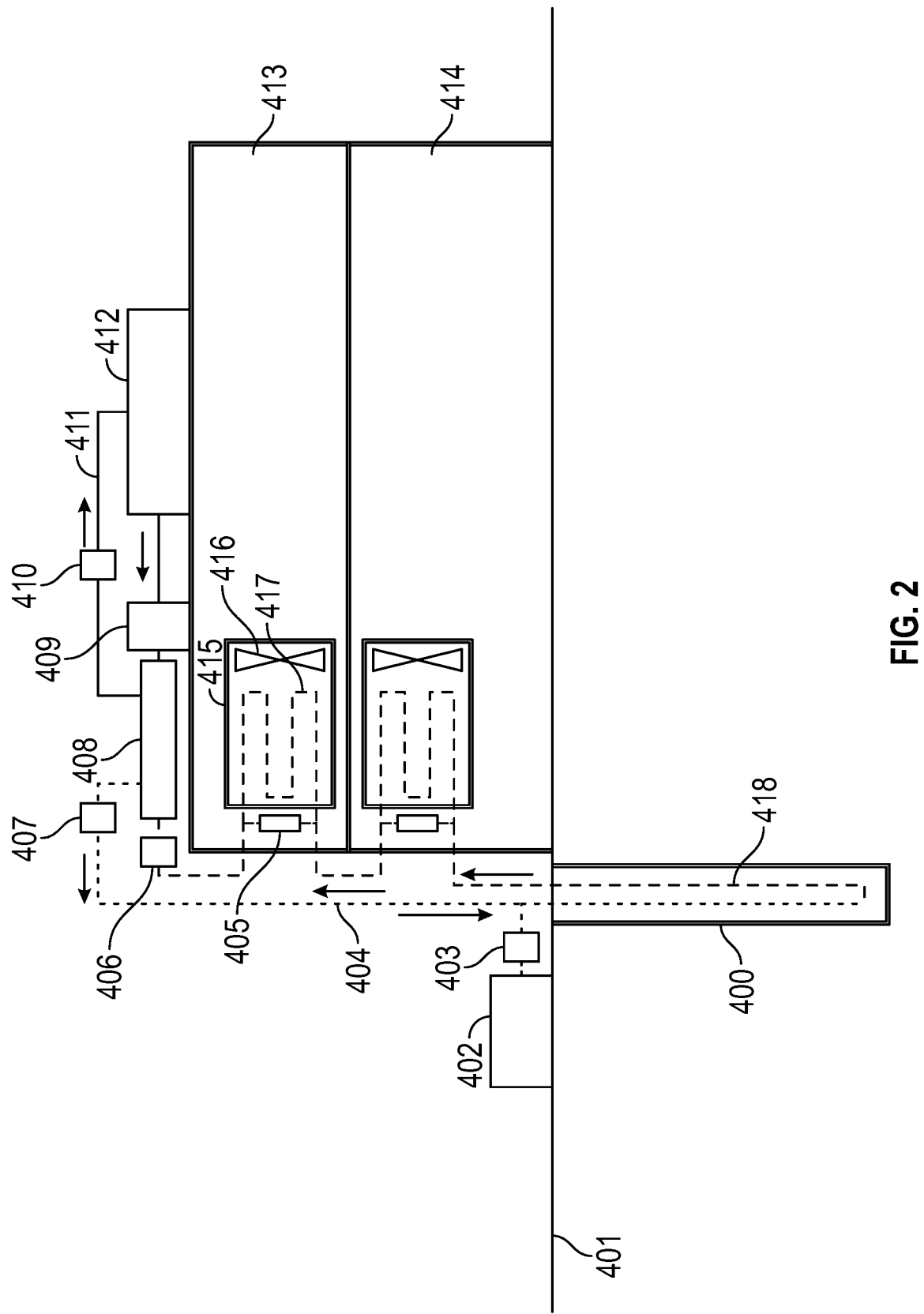
FIG. 2 is a schematic plan view of a geothermal application of the HAMFOP of FIG. 1 for the temperature regulation of a building, where the HAMFOP condenser is located underground in a vertical hole in the ground.

A HAMFOP implementation of a heat-activated pump for geothermal cooling application is shown in FIG. 2. In FIG. 2 it is implemented in a vertical earth-to-liquid configuration wherein the condenser (and connecting piping) is situated in a deep, drilled or dug, vertical hole. It can also be implemented in a horizontal earth-to-liquid configuration in situations where digging a deep hole is not possible, but a large horizontal area is available for digging or drilling a covered horizontal trench. The covered horizontal trench can be either alongside or under the building being cooled, depending upon whichever is most practical when the geothermal HAMFOP cooler is being installed. In either vertical or horizontal configuration, the condenser piping may be a single loop or multi-loop formation.

The principle of operation is as follows: A heat generator and evaporator mechanism 412 produces heat from any of various sources (e.g., evacuated solar collectors, biomass generators, etc.). The heat is used to convert the working fluid to vapor in the HAMFOP evaporator 412. As the pressure rises, it activates the pressure control valve 409 in the HAMFOP, thus pushing the pumped fluid out of the piston chamber 408 through pump valve 407 into pump line 404. The evaporator mechanism 412 is replenished with working fluid through a return line 411 with an injector return valve 410.

Fresh pumped fluid is pulled into the piston chamber 408 through valve 406 by suction, thus pulling in the pumped fluid from the colder (condenser) section 418 buried in a hole 400 in the colder earth 401 into cooling coils 417 of the space cooler enclosure(s) 415. This process ensures that the colder fluid from the earth 401 is pulled up through the condenser suction line 418 into coils 417 for temperature control of the living spaces 413 and 414, where the fluid becomes warm and takes heat out of the living spaces.

The process continues so long as the heat generator 412 can produce heat to transform the working fluid from liquid to vapor. In most hot climates, the need for cooling is highest when the ambient temperature is hottest. So, commercially available evacuated solar collectors can be used to generate the heat to produce the vapor. A reservoir 402 could also be mounted next to the HAMFOP pump to store liquid to run during the night, when solar heat generators are not available. The reservoir 402 is connected to the pump line 404 via a manually operated control valve 403.

The rate of transferring the heat from the living spaces 413 and 414 into the evaporator 412 can be accelerated by using a battery-operated simple recirculation fan 416. However, if needed, a pelton wheel, which is rotated by the flowing pumped fluid and moves the external air in the immediate vicinity of the evaporator to enhance airflow, could be incorporated into the pumped fluid pipeline 417. A bypass valve 405 is also included to limit the cooling to just one room or both, depending on the cooling needs.

Figure 4:
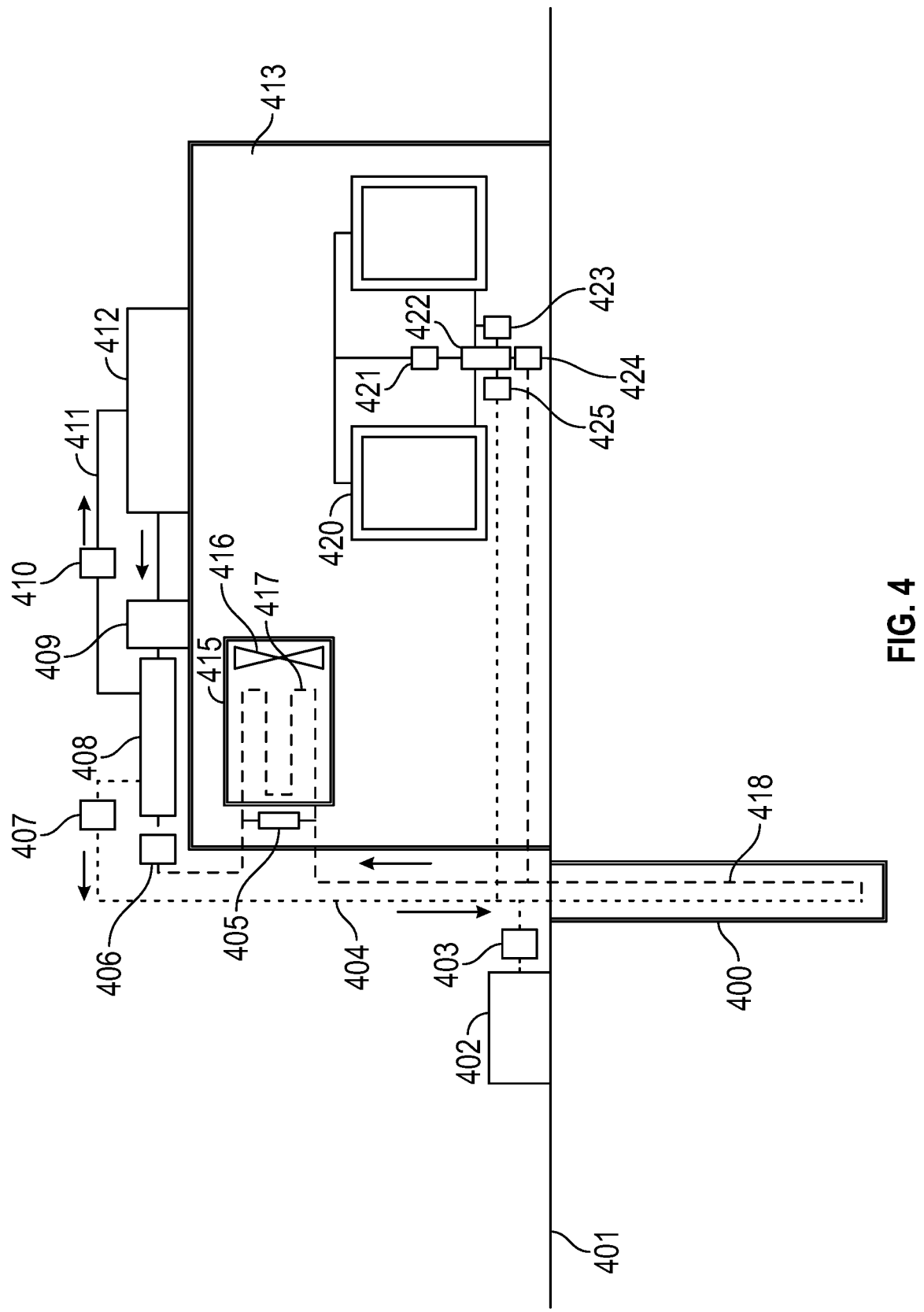
FIG. 4 is a schematic plan view of a geothermal application of the HAMFOP of FIG. 1 for temperature regulation of a building, where the HAMFOP evaporator is in the form of windows employed as heat generators.

With reference to FIG. 4, a significant amount of heat enters through the windows in many buildings, especially in high temperature tropical areas where the sun shines for most of the year. So, it would be even more effective if the heat coming in through the windows is also captured and used to cool the living space. This serves two benefits: the heat input into the living space from the windows is reduced, and the heat captured can be used to keep pumping the cooler fluid from the ground. In this embodiment, the configuration is basically the same as in FIG. 2, but with the inclusion of the windows 420 to also serve as heat generators for driving a HAMFOP. Most modern windows are double or triple paned to reduce noise, vibrations, and heat. The HAMFOP is installed using some or all of the space between panes to hold working fluid where the heat gets trapped and can be used to heat and vaporize the working fluid. As before, a pressure control valve 421 allows vaporized working fluid to enter a piston-suction chamber 422. The working fluid in the window evaporator 420 is replenished through an injection return valve 423. The working fluid in the piston-suction chamber 422 expels pumped fluid therefrom through a pump valve 425 to the condenser lines 418 in a vertical (or horizontal) hole 400 in the ground 401. After cooling the building space 413 via coils 417 in an enclosure 415, pumped fluid returns to the window piston-suction chamber 422 via suction valve 424.

Figure 5A:
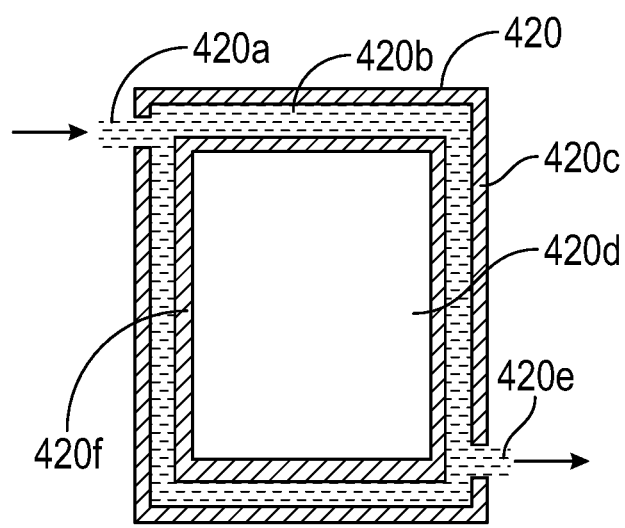
FIGS. 5A and 5B are respective front plan and side sectional views of the window evaporators of FIG. 4.
Figure 5B:
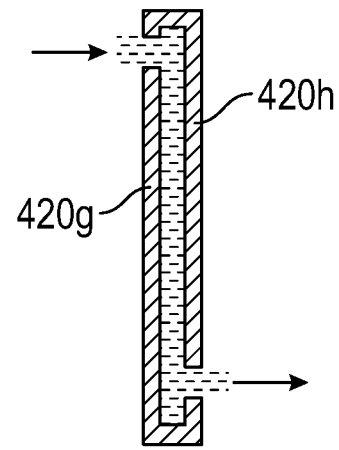

Several windowpanes also use a protective coating that reduces the amount of radiant heat that enters. As seen in FIGS. 5A and 5B, the gap in a central portion 420d of the window 420 may be filled with a gas like argon, while the working fluid flows in a cavity 420b around a perimeter portion of the window 420. The working fluid enters the window 420 through a return port 420a and leaves the window 420 through an exit port 420e to the pressure control valve 421 (in FIG. 4). In a multi-pane window, front and back panes 420g and 420h may be formed of radiation absorbent material at least in the perimeter sections nearest the cavity 420b containing the working fluid. Likewise, outer and inner perimeter borders 420c and 420f will allow heat transfer to the working fluid. The panes and perimeter borders are heated by the radiant sunlight coming in and by the convective currents formed in the inter-pane gap due to the air/gas present. The width of the perimeter heater region can be optimized to minimize visual obstruction while still obtaining useful heat. A single HAMFOP pump can be powered by multiple windows or one per window. The piping can be built into the wall for aesthetic reasons when the home is being constructed, such that the occupant would not even notice its presence.

Figure 3:
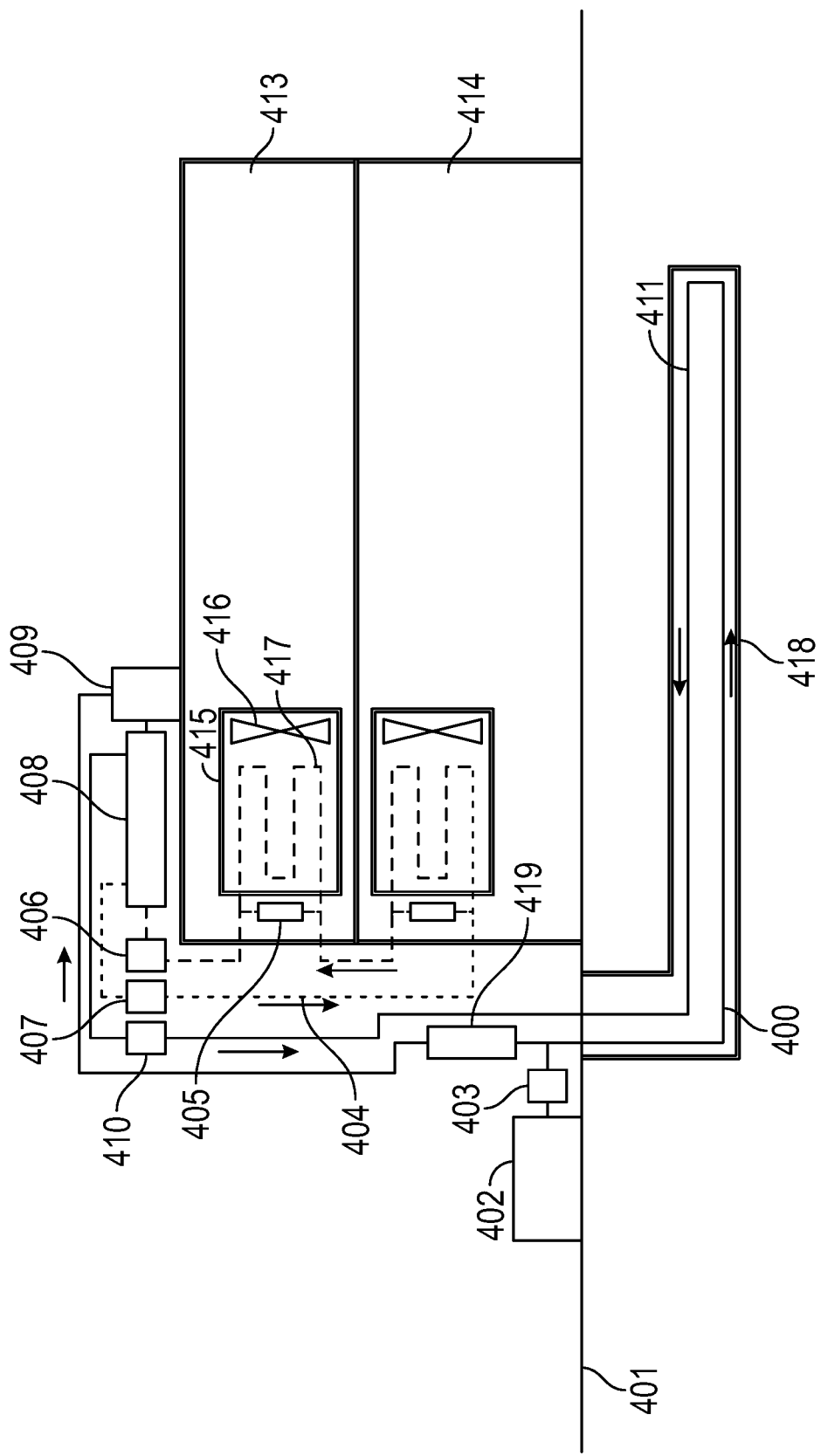
FIG. 3 is a schematic plan view of a geothermal application of the HAMFOP of FIG. 1 for the temperature regulation of a building, where the HAMFOP evaporator is located underground in in a covered horizontal trench in the ground.

The implementation described so far is for cooling applications. HAMFOP can also be used for heating applications, where the ambient temperature in the living space 413 and 414 is quite low and the temperature of the earth 401 is higher. In temperate climates, the ambient earth temperature is typically in the 10° to 23° C. (50° to 73° F.) range. Winter temperatures can be −8° C. to 0° C. in many temperate areas. With reference to FIG. 3, the HAMFOP would be installed so that the working fluid is heated when flowing in the underground passages 411 and 418, which is then used to pump heated fluid through the living space 413 and 414 to heat it up. Doing this can raise the living space temperature to the same temperature as the ground.

The construction in FIG. 3 is like that shown in FIG. 2, but the underground passages 411 and 418 now serve as the HAMFOP's evaporator. Although shown here in a horizontal configuration in a buried trench 400, the passages 411 and 418 could also be arranged in a vertical hole. The pressure control valve 409 couples the underground inlet passage 418 to the liquid-piston chamber 408. Working fluid returns to the underground evaporator via the injector return valve 410. Pumped fluid is expelled in a pump stage from the liquid-piston chamber 408 via pump valve 407 to the radiator coils 417 in heater enclosures 415 in the rooms 413 and 414, which function as the pump's condenser, thereby the heating the rooms. As in the cooling embodiment, recirculation fans 416 may aid in the movement of air leading in this case to heat dispersal throughout the rooms 413 and 414. The pumped fluid returns in a suction stage to the liquid-piston chamber 408 via suction valve 406.

In colder areas, the living space temperature needs to be raised higher than the ground temperature. For instance, if the ground temperature is 15° C., and the target living space temperature is 25° C., then the living space temperature would need to be raised by another 10° C. above that of the ground. To achieve this, the inlet pipe 411 from the ground 401 can be pre-heated with an augmenting preheater 419 by another 10° C. It is more energy efficient to heat up the pumped fluid instead of heating air. The pumped fluid is 10× more efficient in distributing the heat across the living space. The auxiliary preheater 419 will only need to heat the fluid by 10° C., which is also more efficient than directly heating the living space from −8° C. to 25° C.

While a similar arrangement can be used for heating or cooling, the placement of the HAMFOP evaporator/condenser relative to the living spaces will depend on which capability is more frequently needed. If heating is needed more often than cooling, the HAMFOP condenser can be placed close to the floor. If cooling is needed more often than heating, the HAMFOP evaporator can be placed close to the roof. If both capabilities are independently needed, then two separate units for performing both functions independently can be installed, and either can be activated as needed.

What is claimed is:

1. A heat-activated multiphase fluid-operated pump for cooling a building, comprising:
    an evaporator containing a working fluid and receptive of heat from the building to convert a liquid phase of the working fluid into a vapor phase of the working fluid;
    a pressure-control safety valve coupled to an exit port of the evaporator and maintaining the working fluid in the evaporator at a set target pressure and allowing the vapor phase of the working fluid to escape through the exit port whenever the set target pressure is exceeded;
    a liquid-piston chamber coupled to the pressure-control valve to receive the vapor phase of the working fluid from the evaporator at the set target pressure, the vapor phase of the working fluid expanding adiabatically and displacing a liquid within the liquid-piston chamber, expelling the displaced liquid therefrom in a pumping stage of a thermodynamic cycle;
    a unidirectional injector return check valve coupled to both a first exit port of the liquid-piston chamber and to an input port of the evaporator, wherein periodic pressure pulses of a liquid phase of the working fluid from the liquid-piston chamber that temporarily exceed the pressure in the evaporator facilitate jets of the liquid phase of the working fluid to return to the evaporator in successive brief spurts;
    a unidirectional pump-exit check valve coupled to a second exit port of the liquid-piston chamber to allow the displaced liquid to exit the liquid-piston chamber;
    a unidirectional liquid suction-entry check valve coupled to a return port of the liquid-piston chamber; and
    a heat exchanger coupled to the unidirectional pump-exit check valve to receive the displaced liquid from the liquid piston-chamber, the heat exchanger located underground at a substantially constant earth temperature to serve as a heatsink, the heat exchanger also coupled to the unidirectional suction-entry check valve to allow the displaced liquid, in a suction stage of the thermodynamic cycle, to return to the liquid-piston chamber via cooling lines in one or more rooms of a building.

2. A heat-activated pump as in claim 1, wherein the heat exchanger is situated in vertical hole in the ground.

3. A heat-activated pump as in claim 1, wherein the heat exchanger is situated in a covered horizontal trench in the ground.

4. A heat-activated pump as in claim 1, wherein the evaporator is coupled to a rooftop solar heater.

5. A heat-activated pump as in claim 1, wherein the evaporator comprises one or more multi-pane windows of the building, the windows having one or more regions with solar radiation-absorbent material thermally coupled to a fluid cavity.

6. A heat-activated pump as in claim 5, wherein working fluid flows in passageways in thermal contact with the windows.

7. A heat-activated pump as in claim 6, wherein working fluid flows around a perimeter of the windows.

8. A heat-activated pump as in claim 1, wherein the liquid in the liquid-piston chamber is the same material as the working fluid.

9. A heat-activated pump as in claim 1, wherein the liquid displaced from the liquid-piston chamber is a different immiscible material of different density from the working fluid, the heat-activated pump further comprising a separator coupled between the liquid-piston chamber and the first exit port of the liquid-piston chamber to direct the liquid phase of the working fluid to the unidirectional injector return check valve leading back to the evaporator and the displaced liquid to the unidirectional pump-exit check valve leading to the heat exchanger.

10. A method of operating a heat-activated multiphase fluid-operated pump for cooling a building, comprising:
    applying external heat to an evaporator to convert a liquid phase of a working fluid therein to a vapor phase of the working fluid;
    allowing, whenever a set target pressure in the evaporator is exceeded, the vapor phase of the working fluid to escape into a liquid-piston chamber through a pressure-control safety valve coupled to an exit port of the evaporator, the vapor phase of the working fluid expanding adiabatically and displacing a liquid within the liquid-piston chamber to expel the displaced liquid from the liquid-piston chamber through a second exit port with a unidirectional pump-exit check valve in a pumping stage of a thermodynamic cycle;
    returning jets of a liquid phase of the fluid to the evaporator through an input port of the evaporator coupled to a unidirectional injector return check valve in period pressure pulses from a first exit port of the liquid-piston chamber when the liquid phase of the working fluid temporarily exceeds the pressure in the evaporator;
    receiving the displaced liquid from the liquid-piston chamber in a heat exchanger coupled to the unidirectional pump-exit check valve, the heat exchanger located underground at a substantially constant earth temperature to serve as a heat sink;
    allowing the displaced liquid in the heat exchanger to return through a unidirectional liquid suction-entry check valve coupled to a return port of the liquid-piston chamber in a suction stage of the thermodynamic cycle, the liquid returning to the liquid-piston chamber through cooling lines in one or more rooms of a building; and
    repeating the foregoing steps in multiple thermodynamic cycles.

11. A method as in claim 10, wherein the evaporator is coupled to a rooftop solar heater.

12. A method as in claim 10, wherein the heat exchanger is situated in vertical hole in the ground.

13. A method as in claim 10, wherein the heat exchanger is situated in a covered horizontal trench in the ground.

14. A method as in claim 10, wherein the evaporator comprises one or more multi-pane windows of the building, the windows having one or more regions with solar radiation-absorbent material thermally coupled to a fluid cavity.

15. A heat-activated multiphase fluid-operated pump for heating a building, comprising:
- an evaporator, located underground at a substantially constant earth temperature serving as a heat source, and containing a working fluid receptive of heat to convert a liquid phase of the working fluid into a vapor phase of the working fluid;
- a pressure-control safety valve coupled to an exit port of the evaporator and maintaining the working fluid in the evaporator at a set target pressure and allowing the vapor phase of the working fluid to escape through the exit port whenever the set target pressure is exceeded;
- a liquid-piston chamber coupled to the pressure-control valve to receive the vapor phase of the working fluid from the evaporator at the set target pressure, the vapor phase of the working fluid expanding adiabatically and displacing liquid within the liquid-piston chamber, expelling the displaced liquid therefrom in a pumping stage of a thermodynamic cycle;
- a unidirectional pump-exit check valve coupled to a second exit port of the liquid-piston chamber to allow the displaced liquid to exit the liquid-piston chamber;
- a unidirectional liquid suction-entry check valve coupled to a return port of the liquid-piston chamber;
- a heat exchanger coupled to the unidirectional pump-exit check valve and to the unidirectional suction-entry check valve to receive the displaced liquid and allow it to return to the liquid-piston chamber in a suction stage of the thermodynamic cycle, the heat exchanger located in one or more rooms of a building to radiate heat thereto; and
- a unidirectional injector return check valve coupled to both a first exit port of the liquid-piston chamber and to an input port of the evaporator, wherein periodic pressure pulses of a liquid phase of the working fluid from the liquid-piston chamber that temporarily exceed the pressure in the evaporator facilitate jets of the liquid phase of the working fluid to return to the evaporator in successive brief spurts.

16. A heat-activated pump as in claim 15, wherein the evaporator is situated in vertical hole in the ground.

17. A heat-activated pump as in claim 15, wherein the evaporator is situated in a covered horizontal trench in the ground.

18. A method of operating a heat-activated multiphase fluid-operated pump for heating a building, comprising:
- applying external heat to an evaporator to convert a liquid phase of a working fluid therein to a vapor phase of the working fluid, the evaporator located underground at a substantially constant earth temperature serving as a heat source for the working fluid;
- allowing, whenever a set target pressure in the evaporator is exceeded, the vapor phase of the working fluid to escape into a liquid-piston chamber through a pressure-control safety valve coupled to an exit port of the evaporator, the vapor phase of the working fluid expanding adiabatically and displacing liquid within the liquid-piston chamber to expel the displaced liquid from the liquid-piston chamber through a second exit port with a unidirectional pump-exit check valve in a pumping stage of a thermodynamic cycle;
- returning jets of a liquid phase of the working fluid to the evaporator, through a first exit port of the liquid-piston chamber coupled to a unidirectional injector return check valve leading to an input port of the evaporator, in period pressure pulses from the liquid-piston chamber that temporarily exceed the pressure in the evaporator;
- receiving the displaced liquid from the liquid-piston chamber in a heat exchanger coupled to the unidirectional pump-exit check valve;
- allowing condensed the displaced liquid in the heat exchanger to return through a unidirectional liquid suction-entry check valve coupled to a return port of the liquid-piston chamber in a suction stage of the thermodynamic cycle, the liquid returning to the liquid-piston chamber through heating lines in one or more rooms of a building to radiate heat to the rooms; and
- repeating the foregoing steps in multiple thermodynamic cycles.

19. A method as in claim 18, wherein the evaporator is situated in vertical hole in the ground.

20. A method as in claim 18, wherein the evaporator is situated in a covered horizontal trench in the ground.

* * * * *